(12) United States Patent
Kim et al.

(10) Patent No.: US 9,983,916 B2
(45) Date of Patent: May 29, 2018

(54) MEMORY SYSTEM AND OPERATING METHOD THEREOF

(71) Applicant: SK hynix Inc., Gyeonggi-do (KR)

(72) Inventors: Kwang-Su Kim, Gyeonggi-do (KR); Jong-Min Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 26 days.

(21) Appl. No.: 15/179,347

(22) Filed: Jun. 10, 2016

(65) Prior Publication Data

US 2017/0185463 A1    Jun. 29, 2017

(30) Foreign Application Priority Data

Dec. 24, 2015  (KR) .................. 10-2015-0186110

(51) Int. Cl.
| | |
|---|---|
| *G06F 11/07* | (2006.01) |
| *G06F 11/10* | (2006.01) |
| *G11C 29/50* | (2006.01) |
| *G11C 29/42* | (2006.01) |
| *G11C 29/44* | (2006.01) |
| *G11C 29/52* | (2006.01) |
| *G11C 29/00* | (2006.01) |
| *G11C 29/04* | (2006.01) |

(52) U.S. Cl.
CPC ........ *G06F 11/076* (2013.01); *G06F 11/1048* (2013.01); *G06F 11/1072* (2013.01); *G11C 29/42* (2013.01); *G11C 29/44* (2013.01); *G11C 29/50004* (2013.01); *G11C 29/52* (2013.01); *G11C 29/76* (2013.01); *G11C 2029/0409* (2013.01)

(58) Field of Classification Search
CPC .... G06F 11/076; G06F 11/1072; G11C 29/42; G11C 29/50004
See application file for complete search history.

(56) References Cited

U.S. PATENT DOCUMENTS

| | | | |
|---|---|---|---|
| 8,943,386 B1* | 1/2015 | Lee ................ | G06F 11/076 365/185.03 |
| 2002/0049886 A1* | 4/2002 | Furuya ............ | G06F 11/0727 711/114 |
| 2010/0131697 A1* | 5/2010 | Alrod ............. | G06F 11/1068 711/103 |
| 2010/0332922 A1* | 12/2010 | Chang ............ | G11C 5/143 714/704 |
| 2013/0036261 A1 | 2/2013 | Kim et al. | |
| 2013/0051144 A1* | 2/2013 | Suzuki ........... | G06F 3/0616 365/185.11 |
| 2013/0132652 A1* | 5/2013 | Wood ............. | G06F 12/0246 711/103 |
| 2014/0304567 A1* | 10/2014 | Hida .............. | G06F 11/1068 714/773 |
| 2015/0113207 A1 | 4/2015 | Shin | |
| 2016/0141042 A1* | 5/2016 | Peterson ......... | G11C 16/26 365/185.11 |
| 2016/0170871 A1* | 6/2016 | Hyun ............. | G06F 3/06 711/103 |

* cited by examiner

*Primary Examiner* — Kyle Vallecillo
(74) *Attorney, Agent, or Firm* — IP & T Group LLP

(57) ABSTRACT

An operating method of a memory system including a plurality of memory blocks may include grouping the pages of a selected memory block among the plurality of memory blocks based on a program time, sequentially performing a test read on the groups of the pages, detecting an error in the pages of the test-read groups, and reprogramming a page selected based on a result of the error detection.

19 Claims, 12 Drawing Sheets

| GROUP | 1 |
|---|---|
| LAPSE TIME (TSc-TSr) | TH1 OR MORE |
| PAGE | 1, 3 |

| GROUP | 2 |
|---|---|
| LAPSE TIME (TSc-TSr) | TH1~TH1/2 |
| PAGE | 2, 4, 5 |

| GROUP | 3 |
|---|---|
| LAPSE TIME (TSc-TSr) | LESS THAN TH1/2 |
| PAGE | 7, 8 |

MEMORY SYSTEM AND OPERATING METHOD THEREOF

CROSS-REFERENCE TO RELATED APPLICATION

The present application claims priority of Korean Patent Application No. 10-2015-0186110, filed on Dec. 24, 2015, which is incorporated herein by reference in its entirety.

TECHNICAL FIELD

Exemplary embodiments of the present invention relate to a program and test read operation of a memory system and, more particularly, to a memory system for managing data using program time information and an operating method thereof.

DISCUSSION OF THE RELATED ART

The computer environment paradigm has shifted to ubiquitous computing systems that can be used anytime and anywhere. Due to this, use of portable electronic devices, such as mobile phones, digital cameras, and notebook computers has rapidly increased. These portable electronic devices generally use a memory system having one or more semiconductor memory devices for data storage. The semiconductor memory devices simply referred to hereinafter as memory devices may be used as a main or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

SUMMARY

Various embodiments are directed to a memory system for managing data using program time information and an operating method thereof.

In an embodiment, an operating method of a memory system including a plurality of memory blocks may include: grouping the pages of a selected memory block among the plurality of memory blocks based on a program time, sequentially performing a test read on the groups of the pages, detecting an error in the pages of the test-read groups, and reprogramming a page selected based on a result of the error detection.

In an embodiment, an operating method of a memory system including a plurality of memory blocks may include: grouping the pages of a selected block among the plurality of memory blocks by arranging the pages in order of a longer program lapse time, performing a test read on a first group of pages which has a program lapse time equal to or greater than a first threshold value, among the groups, detecting an error in the first page group, reprogramming a selected page of the first page group based on a result of the detection of the error, and regrouping pages other than the selected page into remaining groups.

DETAILED DESCRIPTION

Figure 1:
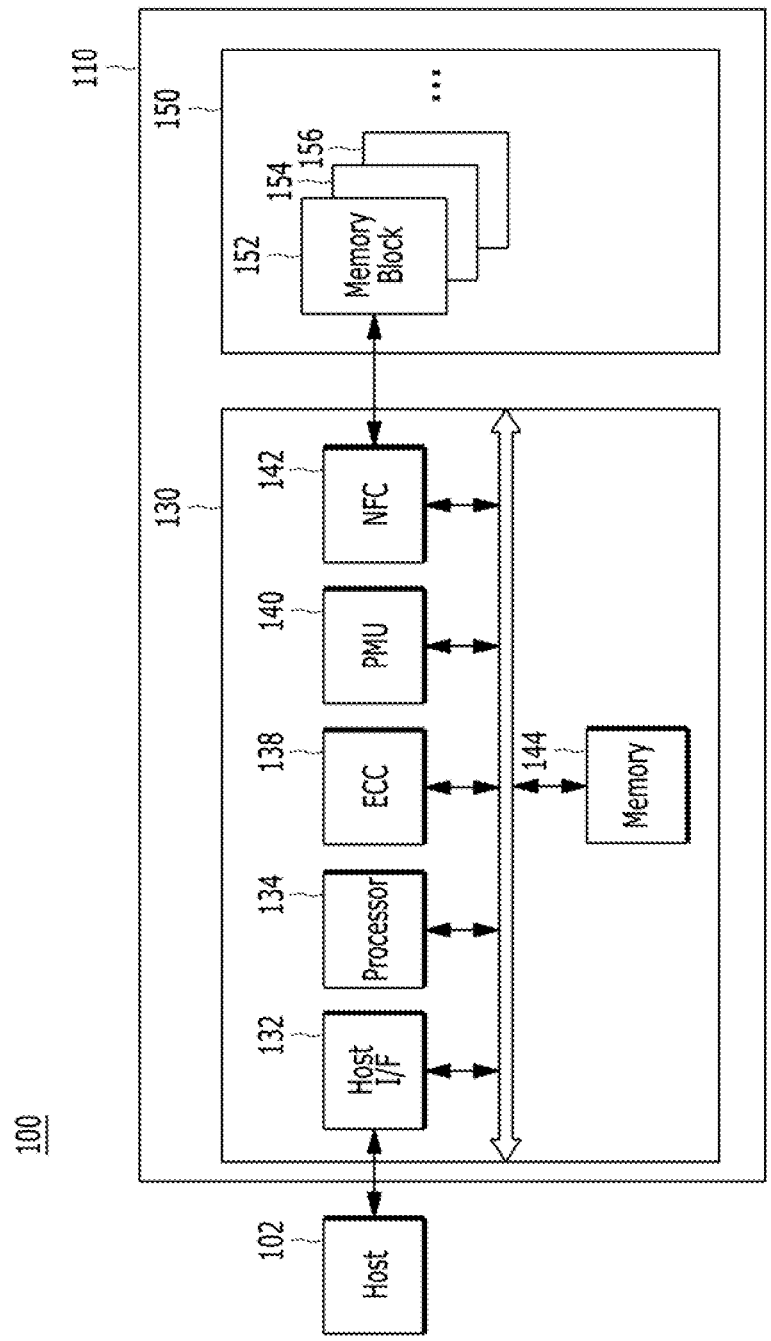
FIG. 1 is a diagram illustrating a data processing system including a memory system according to an embodiment of the present invention.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

In some instances, as would be apparent to one of ordinary skill in the art elements described in connection with a particular embodiment may be used singly or in combination with other embodiments unless otherwise specifically indicated.

Hereinafter, the various embodiments of the present invention will be described in detail with reference to the attached drawings.

Referring now to FIG. 1, a data processing system 100 is provided, according to an embodiment of the present invention. The data processing system 100 may include a host 102 and a memory system 110.

The host 102 may include any suitable electronic device. For example, the host 102 may include a portable electronic device such as a mobile phone, an MP3 player, a laptop computer and the like. The host may include a non-portable electronic device such as a desktop computer, a game player, a TV, a projector and the like.

The memory system 110 may store data to be accessed by the host 102 in response to a request from the host 102. The memory system 110 may be used as a main memory system or an auxiliary memory system of the host 102. The memory system 110 may be implemented to be coupled electrically with the host 102, according to a protocol of a host interface. One or more semiconductor memory devices may be used. Volatile or non-volatile memory devices may be used. For example, the memory system 110 may be implemented with a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as a dynamic random access memory (DRAM), a static random access memory (SRAM) and the like. Alternatively, the storage devices for the memory system 110 may be implemented a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), a resistive RAM (RRAM) and the like.

The memory system 110 may include a memory device 150 for storing data and a controller 130 for controlling storage of data in the memory device 150. The stored data in the memory device 150 may be accessed by the host 102.

The controller 130 and the memory device 150 may be integrated into a single semiconductor device. For instance, the controller 130 and the memory device 150 may be integrated into a semiconductor device configured as a solid state drive (SSD). Configuring the memory system 110 as a SSD, may generally allow a significant increase in an operation speed of the host 102.

The controller 130 and the memory device 150 may be integrated into a semiconductor device configured as a memory card, such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, a universal flash storage (UFS) device and the like.

Also, for example, the memory system 110 may be or comprise a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, one of various component elements configuring a computing system and the like.

The memory device 150 may store data provided from the host 102. During a read operation, the memory device 150 may provide the stored data to the host 102. One or more memory devices 150 may be employed. The one or more memory devices 150 may be substantially identical. The one or more memory devices may be different memory devices. The memory device 150 may include one or more memory blocks 152, 154 and 156. Each of the memory blocks 152, 154 and 156 may include a plurality of pages. Each of the pages may include a plurality of memory cells coupled electrically to a plurality of word lines (WL). The memory device 150 may be a nonvolatile memory device capable of retaining stored data even when a power supply is interrupted or turned off. According to an embodiment, the memory device may be a flash memory. The memory device may be a flash memory device having a three-dimensional (3D) stack structure. Examples of a non-volatile memory device 150 having a three-dimensional (3D) stack structure are described later herein with reference to FIGS. 2 to 11.

The controller 130 may control the overall operation of the memory device 150, such as, read, write, program and/or erase operations. Generally, the controller 130 may control the memory device 150 in response to a request from the host 102. For example, the controller 130 may provide data read from the memory device 150, to the host 102, in response to a read request from the host 102. Or, also as an example, the controller may store data provided from the host 102 into the memory device 150 in response to a write request.

Any suitable controller may be used. For example, the controller 130 may include a host interface unit 132, a processor 134, an error correction code (ECC) unit 138, a power management unit (PMU) 140, a NAND flash controller (NFC) 142, and a memory 144.

The host interface unit 132 may process commands and/or data provided from the host 102. The host interface unit 132 may communicate with the host 102 through at least one of various interface protocols, such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), a small computer system interface (SCSI), an enhanced small disk interface (ESDI), integrated drive electronics (IDE) and the like. The host interface unit 132 may include any suitable circuits, systems or devices suitable for communicating with the host 102 and the other components of the controller 130 as may be needed.

The ECC unit 138 may detect and correct errors of the data read from the memory device 150 during a read operation. Various detection and correction techniques may be employed. For example, if the number of the error bits detected by the ECC unit 138 is greater than or equal to a threshold number of correctable error bits, the ECC unit 138 may not correct the error bits and output an error correction fail signal indicating failure in correcting the error bits.

The ECC unit 138 may perform an error correction operation based on any suitable error correction scheme. For example, the ECC unit 138 may perform an error correction operation based on a coded modulation scheme, such as, for example, a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC unit 138 may include any suitable circuits, systems or devices required for an error detection and correction operation.

The PMU 140 may provide and manage electric power for the controller 130. For example, the PMU 140 may provide and manage electric power for the various components of the controller 130 as may be needed.

The NFC 142 may serve as a memory interface between the controller 130 and the memory device 150 to allow the controller 130 to control the memory device 150 in response to a request from the host 102. For example, the NFC 142 may generate control signals for the memory device 150. The NFC may process data under the control of the processor 134, for example, when the memory device 150 is a flash memory especially a NAND flash memory.

The memory 144 may serve as a working memory of the memory system 110 and the controller 130, and store data for driving the memory system 110 and the controller 130. For example, when the controller 130 controls the operations of the memory device 150, the memory 144 may store data used by the controller 130 and the memory device 150 for such operations as read, write, program and erase operations.

The memory 144 may be or comprise a volatile memory. For example, the memory 144 may be or comprise a static random access memory (SRAM) or a dynamic random access memory (DRAM). As described above, the memory 144 may store data used by the host 102 and the memory device 150 for read and/or write operations. The memory 144 may be or comprise a program memory, a data memory, a write buffer, a read buffer, a map buffer, and the like.

The processor 134 may control the general operations of the memory system 110. For example, the processor 134 may control a write operation for the memory device 150, in response to a write request from the host 102. Also, for example, the processor 134 may control a read operation for the memory device 150, in response to a read request from the host 102. The processor 134 may drive a firmware, also referred to as a flash translation layer (FTL), for controlling the general operations of the memory system 110. The processor 134 may be implemented with a microprocessor, a central processing unit (CPU) and the like. Any suitable processor may be used.

For example, a management unit (not shown) may be included in the processor 134 for performing bad block management of the memory device 150. Accordingly, the management unit may find bad memory blocks included in the memory device 150, i.e., memory blocks which are in an unsatisfactory condition for further use, and perform a bad block management operation the bad memory blocks. For example, when a flash memory, such as a NAND flash memory is employed as the memory device 150, a program failure may occur during a write operation due to inherent characteristics of a NAND logic function. During a bad block management, the data of the program-failed memory blocks (e.g., the bad memory blocks) may be programmed into a new memory block. The bad blocks due to a program fail may seriously deteriorate the utilization efficiency of a memory device, especially one having a 3D stack structure and thus negatively affect the reliability of the memory system 110.

Figure 2:
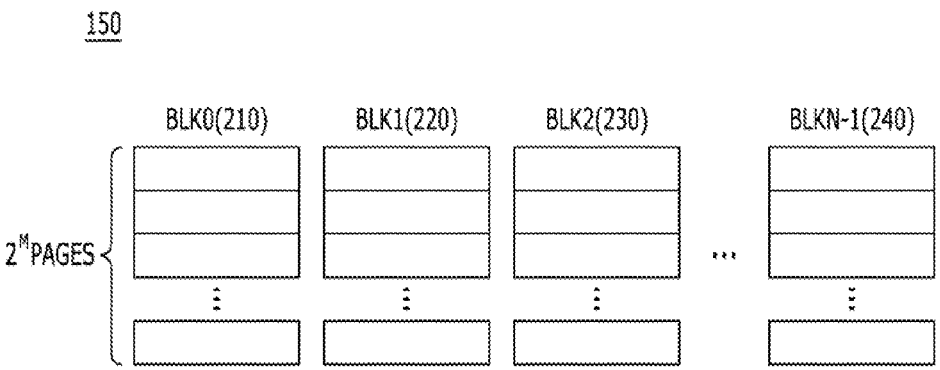
FIG. 2 is a diagram illustrating a memory device in the memory system shown in FIG. 1.

Referring to FIG. 2 the memory device 150 may include a plurality of memory blocks, for example, zeroth to $(N-1)^{th}$ blocks 210 to 240, where N is a positive integer. Each of the plurality of memory blocks 210 to 240 may include a plurality of pages, for example, $2^M$ number of pages ($2^M$ PAGES), where M is a positive integer. Each of the plurality of pages may include a plurality of memory cells to which a plurality of word lines may be coupled electrically. It is noted that any number of suitable blocks and pages per block may be employed.

The memory blocks may be single level cell (SLC) memory blocks and/or multi-level cell (MLC) memory blocks, according to the number of bits which may be stored in each memory cell. An SLC memory block may include a plurality of pages which are implemented with memory cells each of which is capable of storing 1-bit data. An MLC memory block may include a plurality of pages which are implemented with memory cells each of which is capable of storing multi-bit data, for example, two or more-bit data. A MLC memory block including a plurality of pages which are implemented with memory cells each of which is capable of storing 3-bit data may be employed and will be referred to as a triple level cell (TLC) memory block.

Each of the plurality of memory blocks 210 to 240 may store data provided from the host device 102 during a write operation, and may provide stored data to the host 102 during a read operation.

Figure 3:
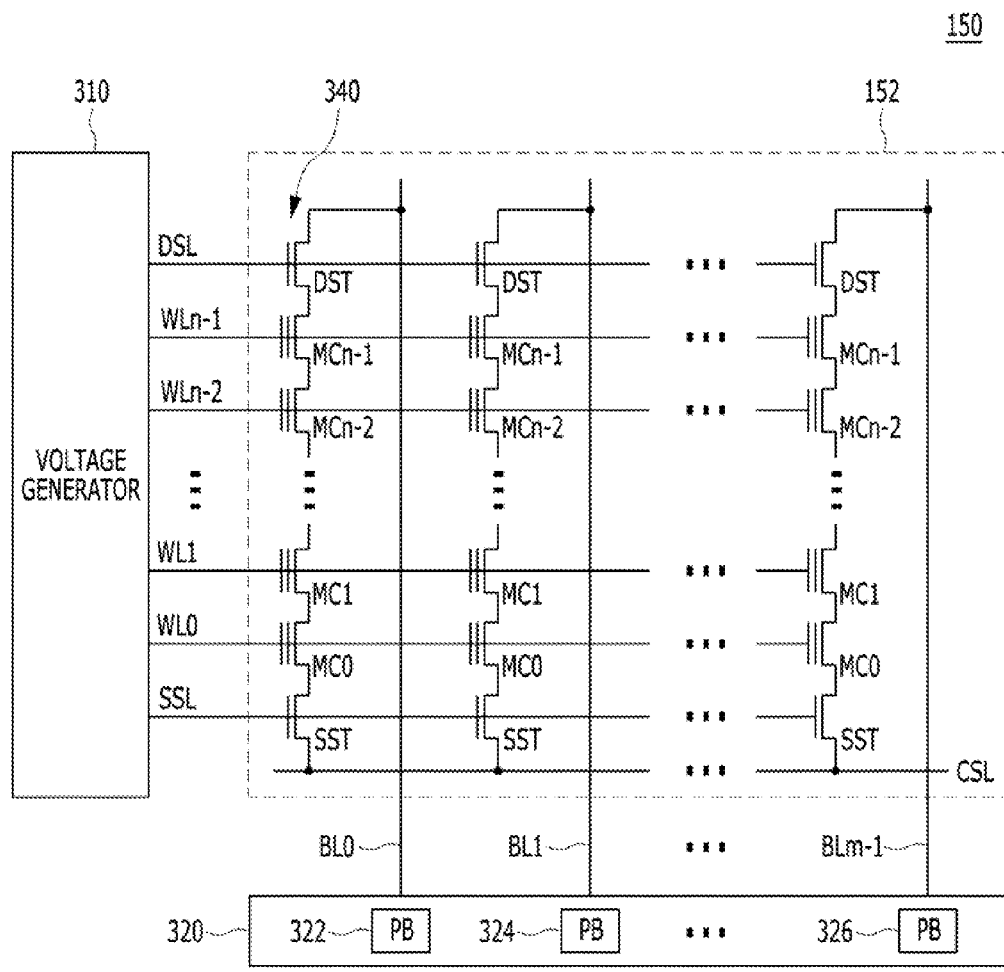
FIG. 3 is a circuit diagram illustrating a memory block in a memory device according to an embodiment of the present invention.

Referring to FIG. 3, a memory block 152 of the memory device 150 may include a plurality of cell strings 340 coupled electrically to bit lines BL0 to BLm-1, respectively. Each cell string 340 may include at least one drain select transistor DST and at least one source select transistor SST. A plurality of memory cells or a plurality of memory cell transistors MC0 to MCn-1 may be coupled electrically in series between the select transistors DST and SST. The respective memory cells MC0 to MCn-1 may consist of multi-level cells (MLC) each of which stores data information of a plurality of bits. The memory cells may have any suitable architecture.

In FIG. 3, 'DSL' denotes a drain select line, 'SSL' denotes a source select line, and 'CSL' denotes a common source line.

FIG. 3 shows, as an example, a memory block 152 configured by NAND flash memory cells. It is to be noted, however, that the memory block 152 is not limited to NAND flash memory and may be realized, in other embodiments, by NOR flash memory, hybrid flash memory having at least two kinds of memory cells combined, or a NAND flash memory having a controller built in a memory chip. Also, the operational characteristics of a semiconductor device may be applied to not only a flash memory device in which a charge storing layer is configured by conductive floating gates but also to a charge trap flash (CTF) in which a charge storing layer is configured by a dielectric layer.

It is also noted that the memory device 150 is not limited to a flash memory device only. For example, the memory device 150 may be a DRAM or a SRAM device.

A voltage generator 310 of the memory device 150 may generate word line voltages, for example, a program voltage, a read voltage or a pass voltage, to be supplied to respective word lines according to an operation mode. The voltage generator 310 may generate voltages to be supplied to bulks, for example, well regions in which the memory cells are formed. The voltage generator 310 may perform a voltage generating operation under a control of a control circuit (not shown). The voltage generator 310 may generate a plurality of variable read voltages to generate a plurality of read data. The voltage generator 310 may select one of the memory blocks or sectors of a memory cell array, select one of the word lines of the selected memory block, and provide the word line voltages to the selected word line and unselected word lines, under the control of the control circuit.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver for driving bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to the columns (or bit lines) or pairs of the columns (or pairs of bit lines). Each of the page buffers 322, 324 and 326 may include a plurality of latches (not shown).

Figure 4:
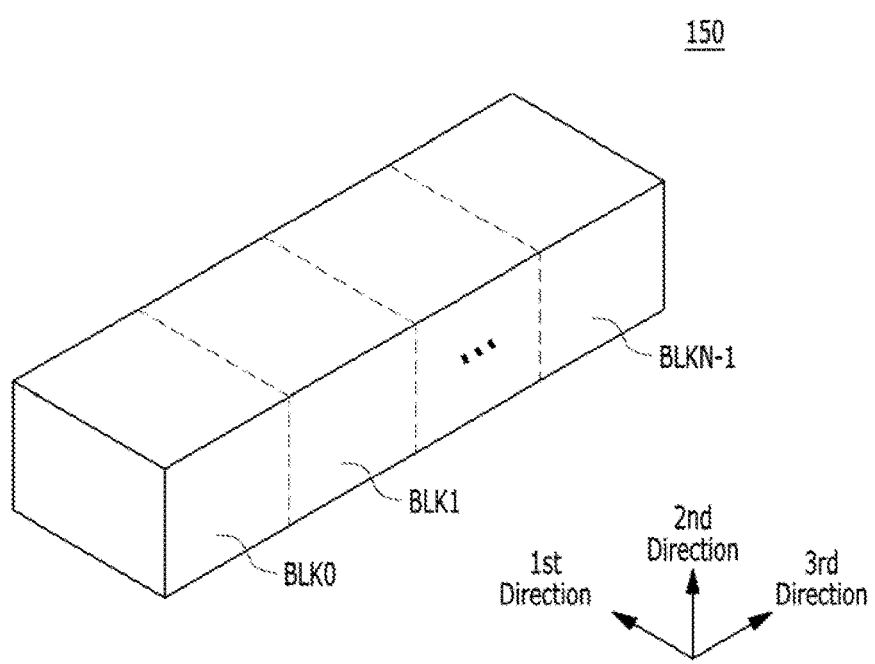
FIGS. 4 to 11 are diagrams schematically illustrating the memory device shown in FIG. 2.

FIG. 4 is a block diagram illustrating an example of the plurality of memory blocks 152 to 156 of the memory device 150, according to an embodiment of the present invention.

As shown in FIG. 4, the memory device 150 may include a plurality of memory blocks BLK0 to BLKN−1. Each of the memory blocks BLK0 to BLKN−1 may be realized in a 3D structure or a vertical structure. The respective memory blocks BLK0 to BLKN−1 may include a plurality of structures extending in first to third directions, for example, an x-axis direction, a y-axis direction and a z-axis direction.

Figure 8:
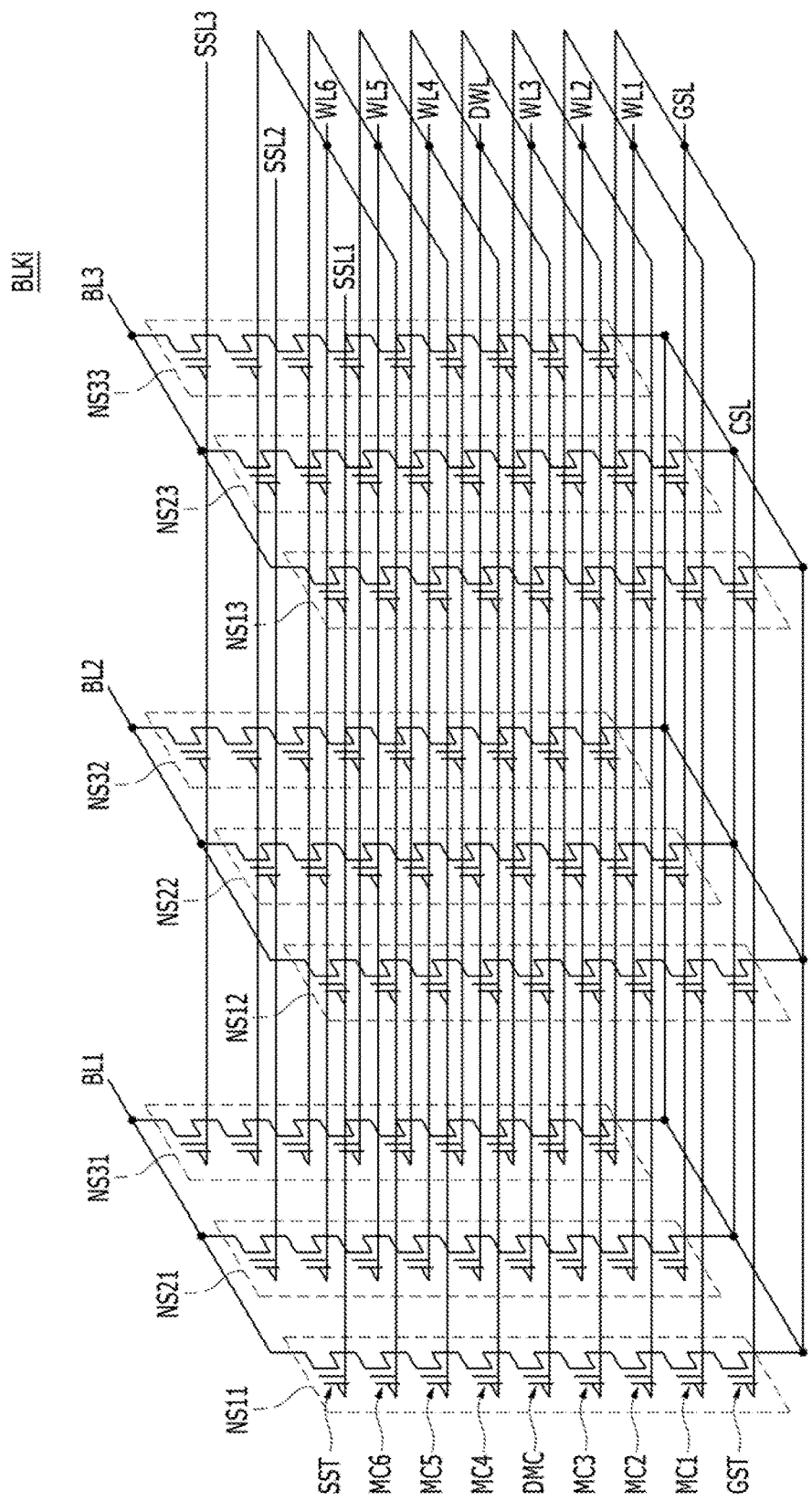

The respective memory blocks BLK0 to BLKN−1 may include a plurality of NAND strings NS extending in the second direction (FIG. 8). The plurality of NAND strings NS may be provided in the first direction and the third direction. Each NAND string NS may be coupled electrically to a bit line BL, at least one source select line SSL, at least one ground select line GSL, a plurality of word lines WL, at least one dummy word line DWL, and a common source line CSL. The respective memory blocks BLK0 to BLKN−1 may be coupled electrically to a plurality of bit lines BL, a plurality of source select lines SSL, a plurality of ground select lines GSL, a plurality of word lines WL, a plurality of dummy word lines DWL, and a plurality of common source lines CSL.

Figure 5:
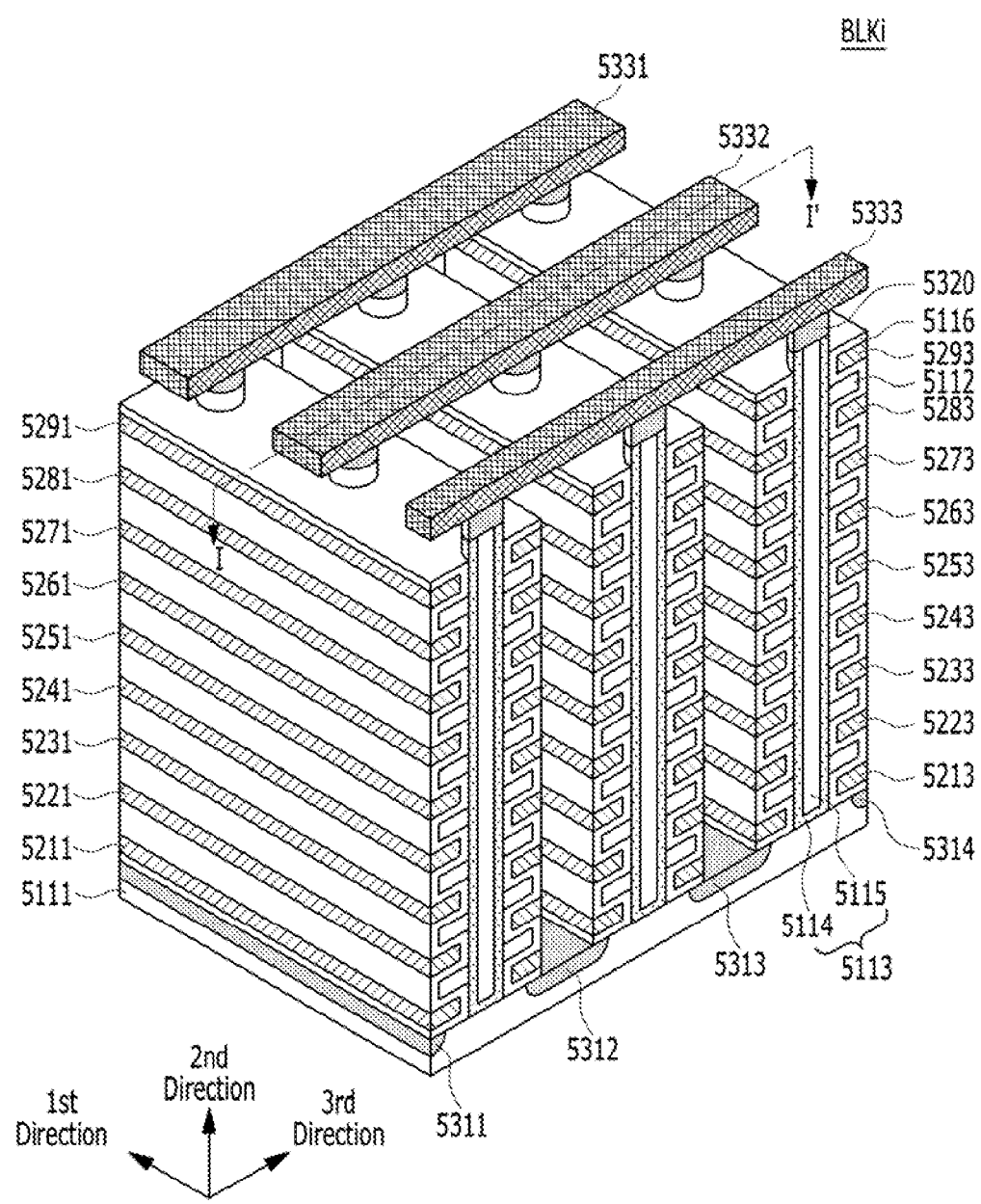
Figure 6:
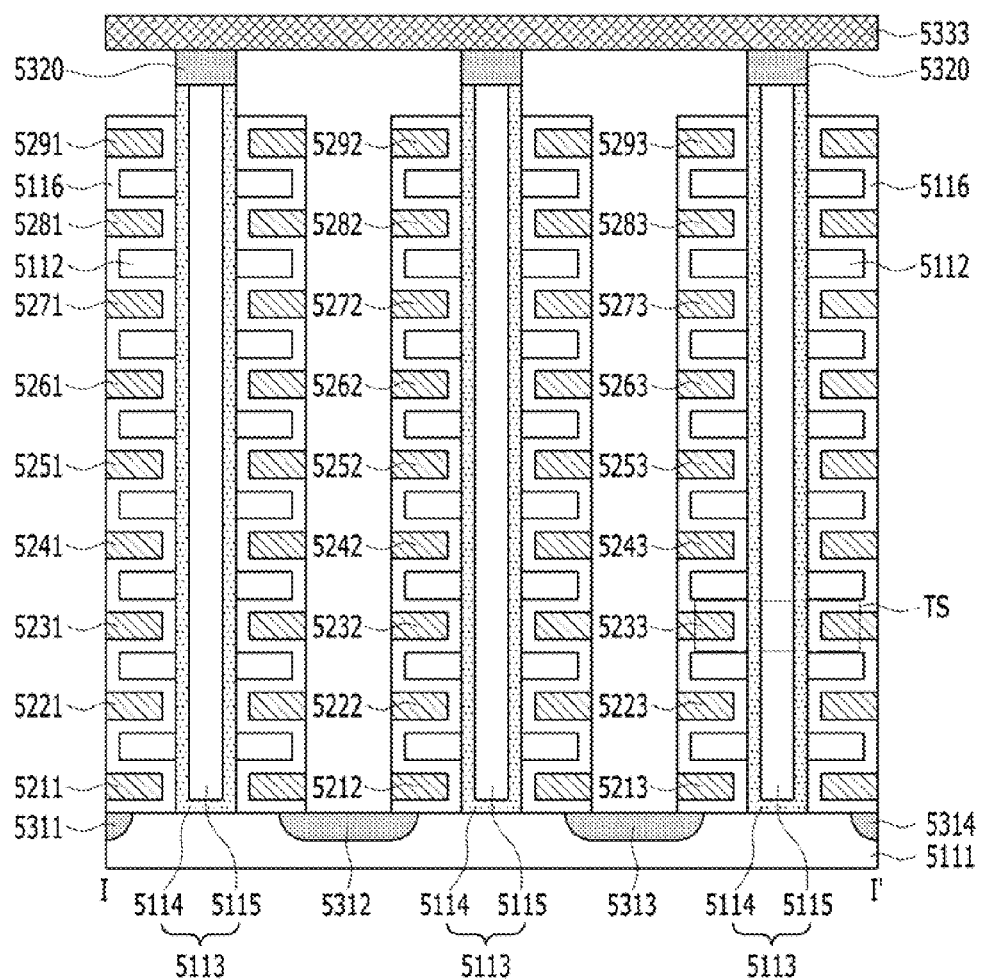

FIG. 5 is a perspective view of one memory block BLKi of the plurality memory blocks BLK0 to BLKN−1 shown in FIG. 4. FIG. 6 is a cross-sectional view taken along a line I-I' of the memory block BLKi shown in FIG. 5.

Referring to FIGS. 5 and 6, memory block BLKi may include a structure extending in the first to third directions.

The memory block may include a substrate 5111 including a silicon material doped with a first type impurity. For example, the substrate 5111 may include a silicon material doped with a p-type impurity. The substrate 5111 may be a p-type well, for example, a pocket p-well. The substrate 5111 may further include an n-type well surrounding the p-type well. Although, in the embodiment of the present invention, the substrate 5111 is exemplified as being the p-type silicon, it is to be noted that the substrate 5111 is not limited to the p-type silicon.

A plurality of doping regions 5311 to 5314 extending in the first direction may be provided over the substrate 5111. The doping regions are spaced apart at regular intervals in the third direction. The plurality of doping regions 5311 to 5314 may contain a second type impurity that is different from that of the impurity used in substrate 5111. For example, the plurality of doping regions 5311 to 5314 may be doped with an n-type impurity. Although, in the embodiment of the present invention, first to fourth doping regions 5311 to 5314 are exemplified as being the n-type, it is noted that they are not limited to the n-type.

In the region over the substrate 5111 between the first and second doping regions 5311 and 5312, a plurality of dielectric material regions 5112 extending in the first direction may be spaced apart at regular intervals in the second direction. The dielectric material regions 5112 may also be separated from the substrate 5111 by a preset distance in the second direction. Each of the dielectric material regions 5112 may be separated from one other by a preset distance in the second direction. The dielectric materials 5112 may include any suitable dielectric material, such as, silicon oxide.

In the regions over the substrate 5111 between two consecutive doping regions, for example, between doping regions 5311 and 5312, a plurality of pillars 5113 are spaced apart at regular intervals in the first direction. The plurality of pillars 5113 extend in the second direction and may pass through the dielectric material regions 5112 so that they may be coupled electrically with the substrate 5111. Each pillar 5113 may include one or more materials. For example, each pillar 5113 may include an in inner layer 5115 and an outer surface layer 5114. The surface layer 5114 may include a doped silicon material doped with an impurity. For example, the surface layer 5114 may include a silicon material doped with the same or same type impurity as the substrate 5111. Although, in the embodiment of the present invention, the surface layer 5114 is exemplified as including p-type silicon, the surface layer 5114 is not limited to the p-type silicon and other embodiments may readily envisaged by the skilled person wherein the substrate 5111 and the surface layer 5114 of the pillars 5113 may be doped with an n-type impurity.

The inner layer 5115 of each pillar 5113 may be formed of a dielectric material. The inner layer 5115 may be or include a dielectric material such as silicon oxide.

In the regions between the first and second doping regions 5311 and 5312, a dielectric layer 5116 may be provided along exposed surfaces of the dielectric material regions 5112, the pillars 5113 and the substrate 5111. A thickness of the dielectric layer 5116 may be less than one half of the distance between the dielectric material regions 5112. In other words, a region of a material other than the dielectric material 5112 and the dielectric layer 5116 may be provided between (i) the dielectric layer 5116 below the bottom surface of a first dielectric material of the dielectric material regions 5112 and (ii) the dielectric layer 5116 provided over the top surface of a second dielectric material of the dielectric material regions 5112. The dielectric material regions 5112 may lie below the first dielectric material.

In the regions between consecutive doping regions such as in the region between the first and second doping regions 5311 and 5312, a plurality of conductive material regions 5211 to 5291 may be provided over an exposed surface of the dielectric layer 5116. The plurality of the conductive material regions extending in the first direction may be spaced apart at regular intervals in the second direction in an interleaving configuration with the plurality of the dielectric material regions 5112. The dielectric layers 5116 fill the space between the conductive material regions and the dielectric material regions 5112. So for example, the conductive material region 5211 extending in the first direction may be provided between the dielectric material region 5112 adjacent to the substrate 5111 and the substrate 5111. In particular, the conductive material region 5211 extending in the first direction may be provided between (i) the dielectric layer 5116 disposed over the substrate 5111 and (ii) the dielectric layer 5116 disposed below the bottom surface of the dielectric material region 5112 adjacent to the substrate 5111.

Each of the conductive material regions 5211 to 5291 extending in the first direction may be provided between (i) a dielectric layer 5116 disposed over the top surface of one of the dielectric material regions 5112 and (ii) the dielectric layer 5116 disposed below the bottom surface of the next dielectric material region 5112. The conductive material regions 5221 to 5281 extending in the first direction may be provided between the dielectric material regions 5112. The top conductive material region 5291 extending in the first direction may be provided over the uppermost dielectric material 5112. The conductive material regions 5211 to 5291 extending in the first direction may be made of or include a metallic material. The conductive material regions 5211 to 5291 extending in the first direction may be made of or include a conductive material such as polysilicon.

In the region between the second doping region 5312 and third doping region 5313, the same structures as the structures between the first and second doping regions 5311 and 5312 may be provided. For example, in the region between the second and third doping regions 5312 and 5313, the plurality of dielectric material regions 5112 extending in the first direction, the plurality of pillars 5113 which are sequentially arranged in the first direction and pass through the plurality of dielectric material regions 5112 in the second direction, the dielectric layer 5116 which is provided over the exposed surfaces of the plurality of dielectric material regions 5112 and the plurality of pillars 5113, and the plurality of conductive material regions 5212 to 5292 extending in the first direction may be provided.

In the region between the third doping region 5313 and a fourth doping region 5314, the same structures as between the first and second doping regions 5311 and 5312 may be provided. For example, in the region between the third and fourth doping regions 5313 and 5314, the plurality of dielectric material regions 5112 extending in the first direction, the plurality of pillars 5113 which are sequentially arranged in the first direction and pass through the plurality of dielectric material regions 5112 in the second direction, the dielectric layer 5116 which is provided over the exposed surfaces of the plurality of dielectric material regions 5112 and the plurality of pillars 5113, and the plurality of conductive material regions 5213 to 5293 extending in the first direction may be provided.

Drains 5320 may be respectively provided over the plurality of pillars 5113. The drains 5320 may be made of silicon materials doped with second type impurities. The drains 5320 may be made of silicon materials doped with n-type impurities. Although for the sake of convenience of explanation, the drains 5320 are exemplified as including n-type silicon, it is noted that the drains 5320 are not limited to the n-type silicon. For example, the width of each drain 5320 may be larger than the width of each corresponding pillar 5113. Each drain 5320 may be provided in the shape of a pad over the top surface of each corresponding pillar 5113.

Conductive material regions 5331 to 5333 extending in the third direction may be provided over the drains 5320. Each of the conductive material regions 5331 to 5333 may be extendedly disposed over the drains 5320 serially arranged in the third direction with a preset separation distance to each other in the first direction. The respective conductive material regions 5331 to 5333 may be coupled electrically with the drains 5320 therebelow. The drains 5320 and the conductive material regions 5331 to 5333 extending in the third direction may be coupled electrically with through contact plugs. The conductive material regions 5331 to 5333 extending in the third direction may be made of a metallic material. The conductive material regions 5331 to 5333 extending in the third direction may be made of a conductive material such as polysilicon.

In FIGS. 5 and 6, the respective pillars 5113 may form strings together with the dielectric layer 5116 and the conductive material regions 5211 to 5291, 5212 to 5292 and 5213 to 5293 extending in the first direction. The respective pillars 5113 may form NAND strings NS together with the dielectric layer 5116 and the conductive material regions 5211 to 5291, 5212 to 5292 and 5213 to 5293 extending in the first direction. Each NAND string NS may include a plurality of transistor structures TS.

Figure 7:
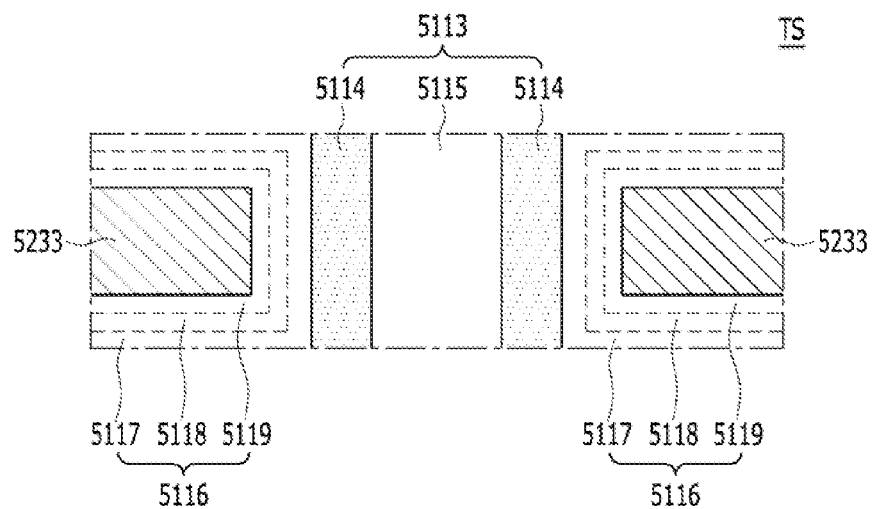

Referring now to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 extending in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. For example, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience of explanation, the surface layer 5114 of p-type silicon in each of the pillars 5113 will be referred to as a body in the second direction.

The memory block BLKi may include the plurality of pillars 5113. For example, the memory block BLKi may include the plurality of NAND strings NS. In detail, the memory block BLKi may include the plurality of NAND strings NS extending in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive material regions 5211 to 5291, 5212 to 5292 and 5213 to 5293 extending in the first direction. For example, the gates or the control gates may extend in the first direction and form word lines and at least two select lines including at least one source select line SSL and at least one ground select line GSL.

The conductive material regions 5331 to 5333 extending in the third direction may be coupled electrically to one end of the NAND strings NS. The conductive material regions 5331 to 5333 extending in the third direction may serve as bit lines BL. For example, in one memory block BLKi, the plurality of NAND strings NS may be coupled electrically to one-bit line BL.

The second type doping regions 5311 to 5314 extending in the first direction may be provided to the other ends of the NAND strings NS. The second type doping regions 5311 to 5314 extending in the first direction may serve as common source lines CSL.

For example, the memory block BLKi may include a plurality of NAND strings NS extending in a direction perpendicular to the substrate 5111, e.g., the second direction, and may serve as a NAND flash memory block, for example, of a charge capturing type memory, in which the plurality of NAND strings NS are coupled electrically to one-bit line BL.

Although it is illustrated in FIGS. 5 to 7 that the conductive material regions 5211 to 5291, 5212 to 5292 and 5213 to 5293 extending in the first direction are provided by nine (9) layers, it is noted that the conductive material regions 5211 to 5291, 5212 to 5292 and 5213 to 5293 extending in the first direction are not limited thereto. For example, conductive material regions extending in the first direction may be provided in eight (8) layers, sixteen (16) layers or any multiple layers. For example, in one NAND string NS, the number of transistors may be 8, 16 or more.

Although it is illustrated in FIGS. 5 to 7 that three (3) NAND strings NS are coupled electrically to one-bit line BL, it is noted that the embodiment is not limited thereto. In the memory block BLKi, m NAND strings NS may be coupled electrically to one-bit line BL, m being a positive integer. The number of conductive material regions 5211 to 5291, 5212 to 5292 and 5213 to 5293 extending in the first direction and the number of common source lines 5311 to 5314 may be varied with the number of NAND strings NS which are coupled electrically to one-bit line BL.

Further, although it is illustrated in FIGS. 5 to 7 that three (3) NAND strings NS are coupled electrically to one conductive material extending in the first direction, it is noted that the embodiment is not limited thereto. For example, n NAND strings NS may be coupled electrically to one conductive material extending in the first direction, n being a positive integer. The number of bit lines 5331 to 5333 may be varied with the number of NAND strings NS which are coupled electrically to one conductive material extending in the first direction.

Referring to FIG. 8, in a block BLKi having the first structure, a plurality of NAND strings NS11 to NS31 may be provided between a first bit line BL1 and a common source line CSL. The first bit line BL1 may correspond to the conductive material region 5331 of FIGS. 5 and 6, extending in the third direction. NAND strings NS12 to NS32 may be provided between a second bit line BL2 and the common source line CSL. The second bit line BL2 may correspond to the conductive material region 5332 of FIGS. 5 and 6, extending in the third direction. NAND strings NS13 to NS33 may be provided between a third bit line BL3 and the common source line CSL. The third bit line BL3 may correspond to the conductive material region 5333 of FIGS. 5 and 6, extending in the third direction.

A source select transistor SST of each NAND string NS may be coupled electrically to a corresponding bit line BL. A ground select transistor GST of each NAND string NS may be coupled electrically to the common source line CSL. Memory cells MC1 and MC6 may be provided between the source select transistor SST and the ground select transistor GST of each NAND string NS.

In this example, the NAND strings NS may be defined by units of rows and columns. The NAND strings NS which are coupled electrically to one-bit line may form one column. The NAND strings NS11 to NS31 which are coupled electrically to the first bit line BL1 may correspond to a first column. The NAND strings NS12 to NS32 which are coupled electrically to the second bit line BL2 may correspond to a second column. The NAND strings NS13 to NS33 which are coupled electrically to the third bit line BL3 may correspond to a third column. The NAND strings NS which are coupled electrically to one source select line SSL may form one row. The NAND strings NS11 to NS13 which are coupled electrically to a first source select line SSL1 may form a first row. The NAND strings NS21 to NS23 which are coupled electrically to a second source select line SSL2 may form a second row. The NAND strings NS31 to NS33 which are coupled electrically to a third source select line SSL3 may form a third row.

In each NAND string NS, a height may be defined. In each NAND string NS, the height of the memory cell MC1 adjacent to the ground select transistor GST may have, for example, a value '1'. In each NAND string NS, the height of a memory cell may increase as the memory cell gets closer to the source select transistor SST when measured from the substrate 5111. For example, in each NAND string NS, the height of a memory cell MC6 adjacent to the source select transistor SST may have, for example, a value '7'.

The source select transistors SST of the NAND strings NS arranged in the same row may share the source select line SSL. The source select transistors SST of the NAND strings NS arranged in different rows may be respectively coupled electrically to the different source select lines SSL1, SSL2 and SSL3.

The memory cells at the same height in the NAND strings NS in the same row may share a word line WL. For example, at the same height, the word lines WL coupled electrically to the memory cells MC of the NAND strings NS in different rows may be coupled electrically with each other. Dummy memory cells DMC at the same height in the NAND strings NS of the same row may share a dummy word line DWL. For example, at the same height or level, the dummy word lines DWL coupled electrically to the dummy memory cells DMC of the NAND strings NS in different rows may be coupled electrically with each other.

The word lines WL or the dummy word lines DWL located at the same level or height or layer may be coupled electrically with each other for each of the layers where the conductive material regions 5211 to 5291, 5212 to 5292 and 5213 to 5293 extending in the first direction may be provided. The conductive material regions 5211 to 5291, 5212 to 5292 and 5213 to 5293 extending in the first direction may be coupled electrically in common to upper layers through contacts. In other words, the ground select transistors GST of the NAND strings NS in the same row may share the ground select line GSL. Further, the ground select transistors GST of the NAND strings NS in different rows may share the ground select line GSL. For example, the NAND strings NS11 to NS13, NS21 to NS23 and NS31 to NS33 may be coupled electrically in common to the ground select line GSL.

The common source line CSL may be coupled electrically in common to the NAND strings NS. Over the active regions over the substrate 5111, the first to fourth doping regions 5311 to 5314 may be coupled electrically. The first to fourth doping regions 5311 to 5314 may be coupled electrically in common to an upper layer through contacts.

For example, as shown in FIG. 8, the word lines WL of the same height or level may be coupled electrically to each other. Accordingly, when a word line WL at a certain height is selected, all NAND strings NS which are coupled electrically to the selected word line WL may be selected. The NAND strings NS in different rows may be coupled electrically to different source select lines SSL. Accordingly, among the NAND strings NS coupled electrically to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, the NAND strings NS arranged in the same row as the selected source line may be selected. Furthermore, by selecting one of the bit lines BL1 to BL3, the NAND strings NS arranged in the same column as the selected bit line may be selected. Accordingly, only the NAND strings NS arranged in the same row as the selected source line and the same column as the selected bit line may be selected.

In each NAND string NS, a dummy memory cell DMC may be provided. In FIG. 8, for example, the dummy memory cell DMC may be provided between a third memory cell MC3 and a fourth memory cell MC4 in each NAND string NS. For example, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into two (2) memory cell groups by the dummy memory cell DMC. In the divided memory cell groups, memory cells, for example, MC1 to MC3, adjacent to the ground select transistor GST may be referred to as a lower memory cell group, and remaining memory cells, for example, MC4 to MC6, adjacent to the string select transistor SST may be referred to as an upper memory cell group.

Herein below, detailed descriptions will be made with reference to FIGS. 9 to 11, which show a memory device in a memory system, according to an embodiment implemented with a three-dimensional (3D) nonvolatile memory device different from the first structure.

Figure 9:
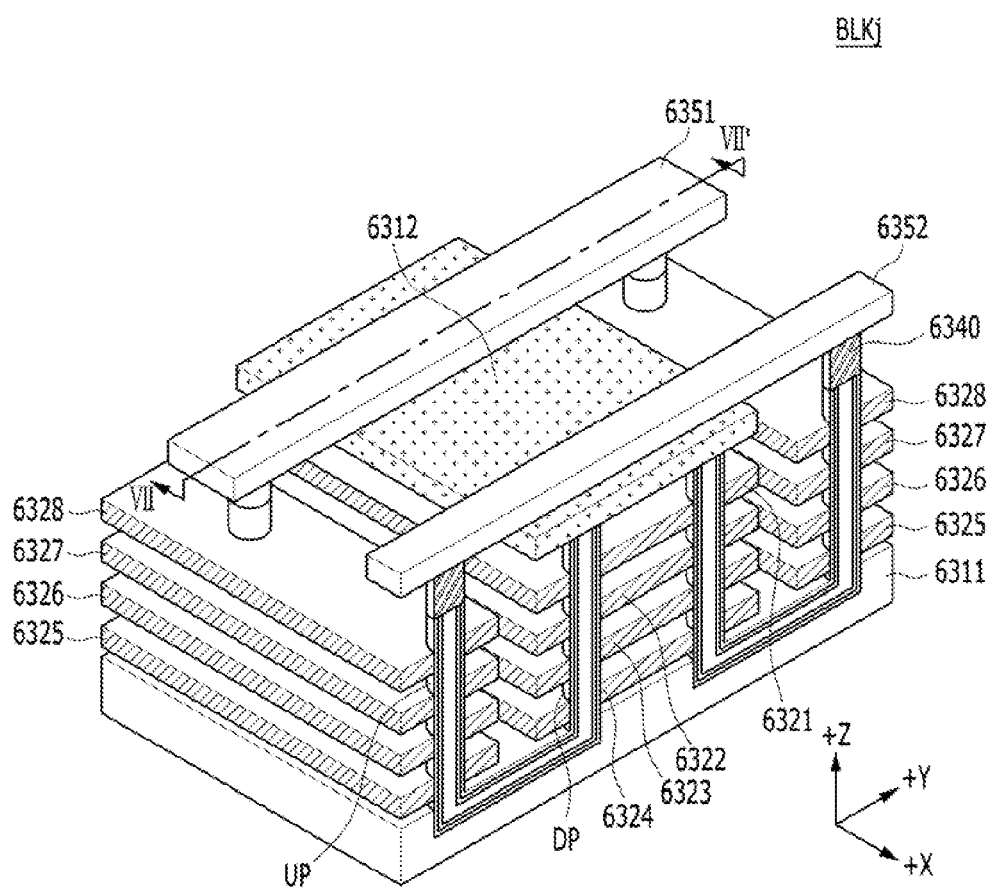

FIG. 9 is a perspective view schematically illustrating a memory device implemented with a three-dimensional (3D) nonvolatile memory device, which is different from the first structure described above with reference to FIGS. 5 to 8 and showing a memory block BLKj of the plurality of memory blocks of FIG. 4. FIG. 10 is a cross-sectional view illustrating the memory block BLKj taken along the line VII-VII' of FIG. 9.

Figure 10:
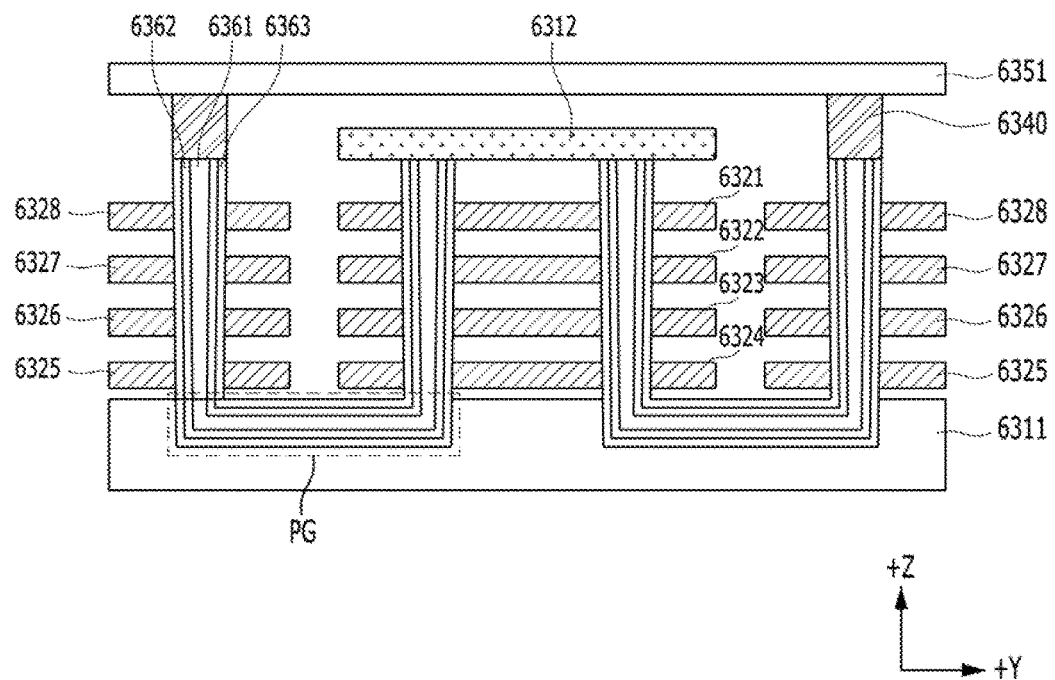

Referring to FIGS. 9 and 10, the memory block BLKj may include structures extending in the first to third directions and may include a substrate 6311. The substrate 6311 may include a silicon material doped with a first type impurity. For example, the substrate 6311 may include a silicon material doped with a p-type impurity. The substrate 6311 may be a p-type well, for example, a pocket p-well. The substrate 6311 may further include an n-type well which surrounds the p-type well. Although, in the described embodiment, the substrate 6311 is exemplified as being the p-type silicon, it is noted that the substrate 6311 is not limited to the p-type silicon.

First to fourth conductive material regions 6321 to 6324 extending in an x-axis direction and a y-axis direction are provided over the substrate 6311. The first to fourth conductive material regions 6321 to 6324 may be separated by a preset distance in the z-axis direction.

Fifth to eighth conductive material regions 6325 to 6328 extending in the x-axis direction and the y-axis direction may be provided over the substrate 6311. The fifth to eighth conductive material regions 6325 to 6328 may be separated by the preset distance in the z-axis direction. The fifth to eighth conductive material regions 6325 to 6328 may be separated from the first to fourth conductive material regions 6321 to 6324 in the y-axis direction.

A plurality of lower pillars DP passing through the first to fourth conductive material regions 6321 to 6324 may be provided. Each lower pillar DP may extend in the z-axis direction. Also, a plurality of upper pillars UP passing through the fifth to eighth conductive material regions 6325 to 6328 may be provided. Each upper pillar UP may extend in the z-axis direction.

Each of the lower pillars DP and the upper pillars UP may include an Internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower and the upper pillars DP and UP may be coupled electrically with each other through a pipe gate PG. The pipe gate PG may be disposed in the substrate 6311. For example, the pipe gate PG may include the same material as the lower pillar DP and the upper pillar UP.

A doping material 6312 of a second type extending in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive material regions 6351 and 6352 extending in the y-axis direction may be provided over the drains 6340.

The first and second upper conductive material regions 6351 and 6352 may be spaced apart along the x-axis direction. The first and second upper conductive material regions 6351 and 6352 may be formed of a metal. The first and second upper conductive material regions 6351 and 6352 and the drains 6340 may be coupled electrically with each other through contact plugs. The first and second upper conductive material regions 6351 and 6352 may serve as first and second bit lines BL1 and BL2, respectively.

The first conductive material 6321 may serve as a source select line SSL. The second conductive material 6322 may serve as a first dummy word line DWL1. The third and fourth conductive material regions 6323 and 6324 may serve as first and second main word lines MWL1 and MWL2, respectively. The fifth and sixth conductive material regions 6325 and 6326 may serve as third and fourth main word lines MWL3 and MWL4, respectively. The seventh conductive material 6327 may serve as a second dummy word line DWL2. The eighth conductive material 6328 may serve as a drain select line DSL.

The lower pillar DP and the first to fourth conductive material regions 6321 to 6324 adjacent to the lower pillar DP may form a lower string. The upper pillar UP and the fifth to eighth conductive material regions 6325 to 6328 adjacent to the upper pillar UP may form an upper string. The lower string and the upper string may be coupled electrically with each other through the pipe gate PG. One end of the lower string may be coupled electrically to the doping material 6312 of the second type which serves as the common source line CSL. One end of the upper string may be coupled electrically to a corresponding bit line through the drain 6340. One lower string and one upper string may form one cell string which is coupled electrically between the doping material 6312 serving as the common source line CSL and a corresponding one of the upper conductive material layers 6351 and 6352 serving as the bit line BL.

For example, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS. The NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
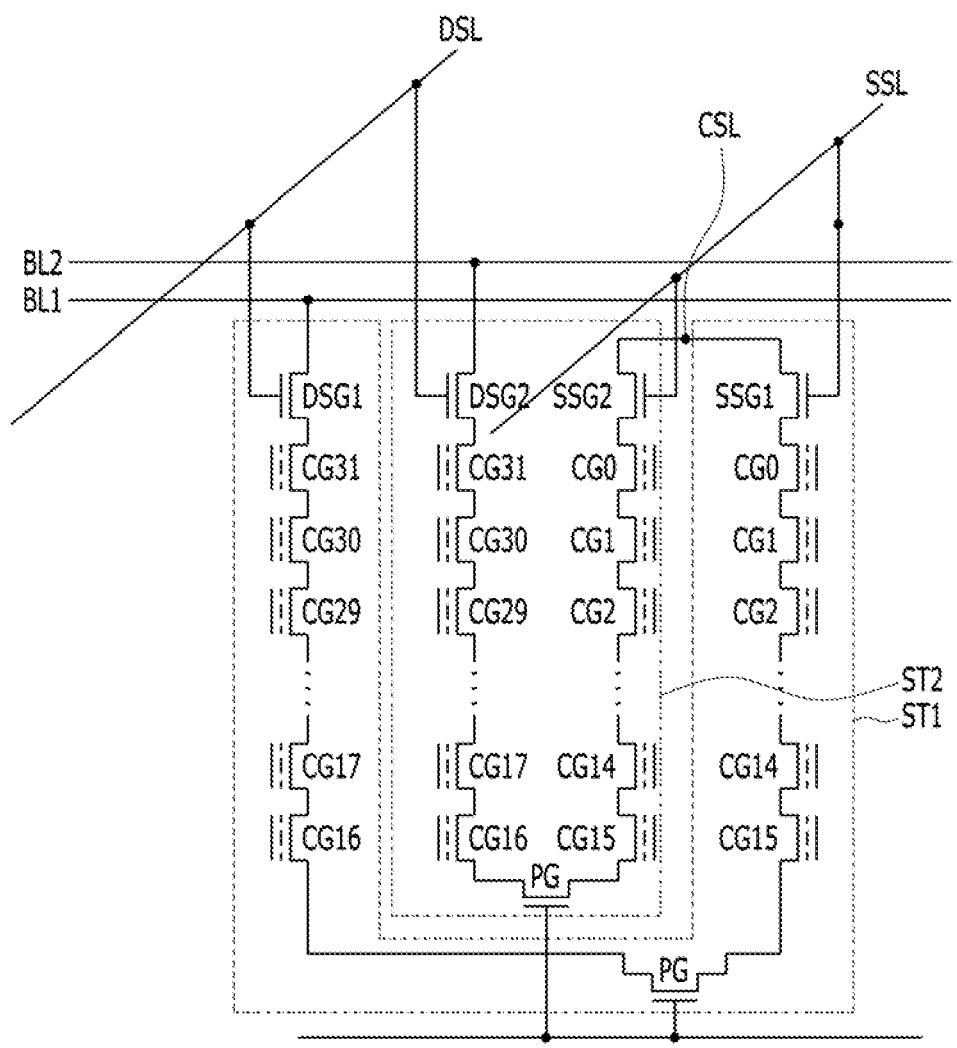

FIG. 11 is a circuit diagram illustrating the equivalent circuit of the memory block BLKj having the second structure as described above with reference to FIGS. 9 and 10. For the sake of convenience, only a first string ST1 and a second string ST2 are shown, forming a pair in the memory block BLKj in the second structure.

Referring to FIG. 11, in the memory block BLKj having the second structure, a plurality of cell strings, each of which is implemented with one upper string and one lower string coupled electrically through the pipe gate PG as described above with reference to FIGS. 9 and 10, may be provided, in such a way as to define a plurality of pairs.

For example, in memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first and the second strings ST1 and ST2 may be coupled electrically to the same drain select line DSL and the same source select line SSL. The first string ST1 may be coupled electrically to a first bit line BL1. The second string ST2 may be coupled electrically to a second bit line BL2.

Although FIG. 11 shows the first string ST1 and the second string ST2 are coupled electrically to the same drain select line DSL and the same source select line SSL, it may be envisaged that the first string ST1 and the second string ST2 may be coupled electrically to the same source select line SSL and the same bit line BL, the first string ST1 may be coupled electrically to a first drain select line DSL1 and the second string ST2 may be coupled electrically to a second drain select line DSL2. Further it may be envisaged that the first string ST1 and the second string ST2 may be coupled electrically to the same drain select line DSL and the same bit line BL, the first string ST1 may be coupled electrically to a first source select line SSL1 and the second string ST2 may be coupled electrically a second source select line SSL2.

Figure 12:
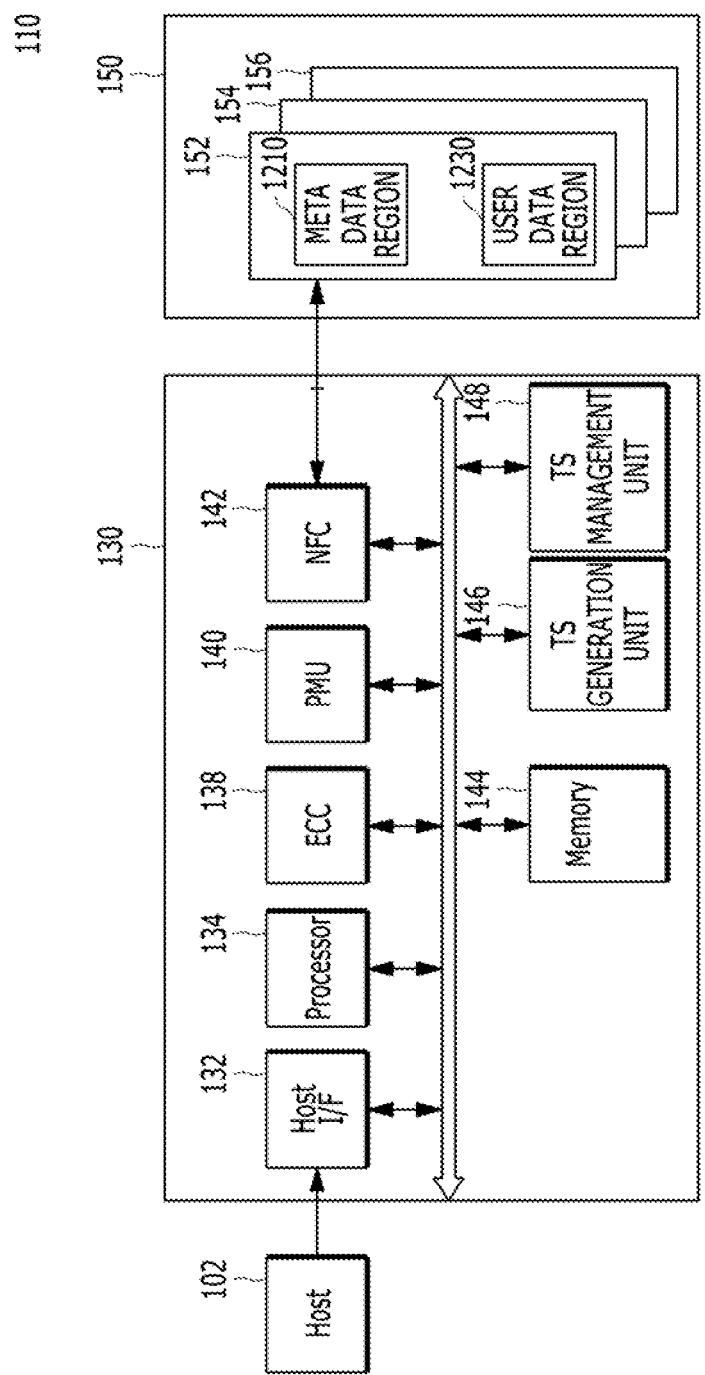
FIG. 12 is a diagram illustrating a memory system according to an embodiment of the present invention.

FIG. 12 is a diagram illustrating a memory system 110, according to an embodiment of the present invention.

According to the embodiment of FIG. 12, the memory system 110 may include the controller 130 and the memory device 150. The controller 130 may include a host interface unit 132, a processor 134, an error correction code (ECC) unit 138, a power management unit 140, a NAND flash controller (NFC) 142, and a memory 144 as shown in FIG. 1. Furthermore, the controller 130 may include a time stamp (TS) generation unit 146 and a TS management unit 148. The memory device 150 includes a plurality of memory blocks 152, 154 and 156. A memory block (e.g., 152) of the memory device 150 may include a meta data region 1210 and a user data region 1230.

The TS generation unit 146 may generate time information TS, by measuring an elapsed time from when the memory system 110 is booted up. The generated time information TS is transferred to the memory device 150 along with user (or program) data transferred when a program request is made by the host 102. For example, the generated time information TS may be stored in the memory device 150 as meta data for the programmed data.

In an embodiment, the TS generation unit 146 may include a clock generation unit (not shown) and a counting unit (not shown). The TS generation unit 146 may generate a real-time clock (RTC) using the clock generation unit after the memory system 110 is booted up and may generate time information TS by counting the RTC using the counting unit. However, we note that the TS generation unit 146 is not limited to the aforementioned specific configuration. Many other configurations may be used for generating time information.

The controller 130 may read time information TS stored in the memory device 150 and control a test read operation for data corresponding to the read time information TS. The time information TS may be read for each memory block and periodically managed. A test read operation may be performed during an idle time when there is no task requested by the host 102 based on the time information TS.

In an embodiment, the TS management unit 148 may compare time information TSr, which is read from the memory device 150, with time information TSc, which is newly generated by the time stamp generation unit 146. The TS management unit 148 may set the test read sequence/time of data corresponding to the read time information TSr based on a difference between the newly generated time information TSc and the read time information TSr. That is, the TS management unit 148 may group pages in which corresponding data is stored based on the difference between the newly generated time information TSc and the read time information TS and manage the page groups, as will be described in more detail later.

The memory block 152 of the memory device 150 may include the user data region 1230 for storing data for which a program request has been made by the host 102 and the meta data region 1210 for storing meta data corresponding to the stored data, i.e., control information relating to the stored data. In an embodiment, the control information may include time information TS. The control information may include other information, such as, for example, error correction code or flag cell information regarding data.

For example, in an embodiment of the present invention, the host 102 may request a program operation regarding data. Then, the controller 130 may generate time information TS for the requested data and transfer the generated time information TS to the memory device 150 along with the data. When the program operation is performed, the memory device 150 may receive the data for which the program operation has been requested and the time information TS from the controller 130 and store the data and the time information TS in the user data region 1230 and the meta data region 1210, respectively.

Figures 13, 14:
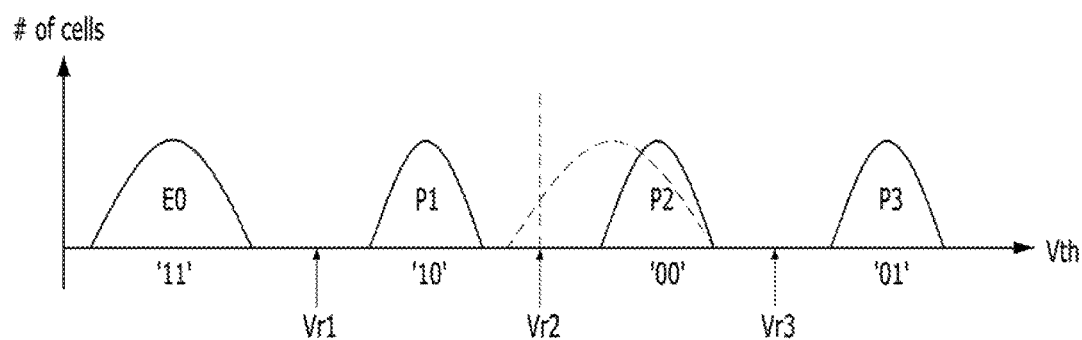
FIG. 13 is a diagram illustrating the threshold voltage distributions of memory cells included in a memory device according to an embodiment of the present invention.
FIG. 14 is a diagram illustrating an operation for grouping pages according to an embodiment of the present invention.

FIG. 13 illustrates the threshold voltage distributions of memory cells included in a memory device, according to an embodiment of the present invention. For example, the distribution of the threshold voltages of FIG. 13 may be the distribution of the threshold voltages of memory cells included in the memory device 150 of FIG. 12. It is noted that FIG. 13 illustrates the threshold voltage distributions of a multi-level cell (MLC) when 2-bit data is stored in a single memory cell.

According to the embodiment of FIG. 13, the horizontal axis Vth represents a threshold voltage of a memory cell, and the vertical axis represents the number of memory cells corresponding to a threshold voltage. An erase state E0 corresponding to data "11" has the lowest threshold voltage level. Furthermore, the threshold voltages may be arranged in a first program state P1 corresponding to data "10", a second program state P2 corresponding to data "00", and a third program state P3 corresponding to data "01." In this case, the corresponding relationship between the 2-bit data "11", "10", "00", and "01" corresponding to the erase state E0 and program states P1, P2, and P3, respectively, is merely an example. The erase state E0 and program states P1, P2, and P3 and the corresponding 2-bit data "11", "10", "00", and "01" may be changed in various ways depending on the design method of the memory device 150.

In the memory device 150, the threshold voltage of a programmed memory cell has one of the plurality of states E0, P1, P2, and P3. When a read operation is performed on the programmed memory cell, read voltages Vr1, Vr2, and Vr3 are applied to the word line of the memory cell. The first read voltage Vr1 may have a voltage level between the erase state E0 and the first program state P1. The second read voltage Vr2 may have a voltage level between the first program state P1 and the second program state P2. The third read voltage Vr3 may have a voltage level between the second program state P2 and the third program state P3.

For example, when the second read voltage Vr2 is applied in a read operation, a memory cell having a threshold voltage corresponding to the erase state E0 or the first program state P1 may be turned on, and a memory cell having a threshold voltage corresponding to the second or third program state P2 or P3 may be turned off. Accordingly, data stored in a memory cell may be checked by detecting the memory cell that is turned on or off in response to the read voltage Vr1, Vr2, or Vr3.

However, a threshold voltage distribution of a memory cell that has been programmed once may be changed due to a loss of charges even without a separate operation. A characteristic of a memory cell commonly known as a retention characteristic determines for how long charges stored in a memory cell are retained in a predetermined condition, that is, for how long the threshold voltage of a memory cell is retained. The retention characteristic of a memory cell deteriorates as the program/erase operations performed on the memory cell increase. As a result, a threshold voltage distribution of a memory cell that has been programmed once may be changed over time. For example, as indicated by the dotted line in FIG. 13, a threshold voltage distribution of a memory cell may be shifted due to a loss of charges occurring over time.

If the retention characteristic of a memory cell deteriorates, the threshold voltage of the programmed memory cell may be gradually lowered over time. For example, as indicated by the dotted line in FIG. 13, the threshold voltage of the memory cell may be gradually shift to a lower level, i.e., may not maintain its original level. If the threshold voltage of the memory cell is lowered, the data of the memory cell may be read as data different from the originally programmed data. For example, if the threshold voltage of a memory cell programmed in the second program state P2 becomes lower than the second read voltage Vr2, the memory cell may be detected as having the erase state E0 or the first program state P1, thereby generating a read error.

Accordingly, in an initial state after a program operation, the program states P1, P2, and P3 may be accurately read based on the respective read voltages Vr1, Vr2, and Vr3. However, one or more memory cells may produce an error in a read operation using the read voltages Vr1, Vr2, and Vr3 when the threshold voltages of the one or more memory cells are changed over time. In an embodiment, for preventing such a read error and for improving the retention characteristic of a memory cell, corresponding time information TS may be stored along with data when a program operation is performed. Furthermore, data after a lapse of a specific time since the memory cell is programmed may be determined based on the stored time information TS, and data that belongs to the determined data and that has an increased possibility that a read retry may occur may be reprogrammed through a test operation. In an embodiment, pages in which the corresponding data is stored may be grouped and managed based on the stored time information TS.

FIG. 14 is a diagram illustrating an operation for grouping pages, according to an embodiment of the present invention. For example, 8 pages of the memory block 152 are illustrated as grouped into three groups, however, we note that the present invention is not limited to this example and that may other variation may be envisaged by the skilled person in this art.

As mentioned above, the TS management unit 148 of the controller 110 may compare time information TSr, which is read from the meta data region 1210 of the memory block 152, with time information TSc, which is newly generated by the time stamp generation unit 146. Furthermore, the TS management unit 148 may group the pages of the memory block 152 into three groups Group1 to Group3 on the basis of a first threshold value TH1 based on the difference between the time information TSc and the time information TSr. For example, if the difference (Tsc−Tsr) (also referred to as a lapse time) is greater than or equal to the threshold value TH1, the corresponding pages Page1 and Page3 are grouped into Group1. If the difference (Tsc−Tsr) (or lapse time) is less than the threshold value TH1 and greater than or equal to the threshold value TH1/2, the corresponding pages Page2, Page4 and Page5 are grouped into Group2. If the difference (Tsc−Tsr) (or lapse time) is less than the threshold value TH1/2, the corresponding pages Page7 and Page8 are grouped into Group3. In an embodiment, the first threshold value TH1 may be a safe time value at which charges charged in a memory cell are not lost.

According to the embodiment of FIG. 14, first and third pages are grouped into a first group Group1 and managed accordingly as a group for a test read operation. Second, fourth, and fifth pages are grouped into a second group Group2 and managed as a group for a test read operation. Seventh and eighth pages are grouped into a third group Group3 and managed as a group for a test read operation. For example, the controller 130 may first perform a test read operation on the first group Group1 that has spent the longest time after a program and then sequentially perform test read operations on the second and the third groups Group2-Group3, in this order. The test read operation may be performed during an idle time when there is no task requested by the host 102 in a state in which a time margin has been set to some extent between operations. In an embodiment, a first threshold value TH1 may be set with some margin for controlling the pages included in each group.

The controller 130 may perform a test read operation on the first page group of pages Page1 and Page3, detect an error included in each of the pages, and reprogram pages having a good possibility that a read retry may subsequently occur into the memory device 150. For example, the controller 130 may reprogram pages including errors (or the number of bits) greater than a preset second threshold value TH2. In an embodiment, the pages including errors are reprogrammed into another memory block 154 or 156 other than the existing memory block 152.

Pages which belong to the test-read pages and also include errors (or the number of bits) smaller than the preset second threshold value TH2 are regrouped by the TS management unit 148. According to an embodiment, the corresponding pages may be included in the second group on which a test read operation is preferentially performed because the program lapse time of the pages has exceeded a reference value, i.e., the first threshold value. According to another embodiment, the corresponding pages may be divided into the second and the third groups depending on errors (or the number of bits) included in each page.

An overall operation of the memory system 110, according to an embodiment of the present invention, is described below with reference to FIG. 15.

Figure 15:
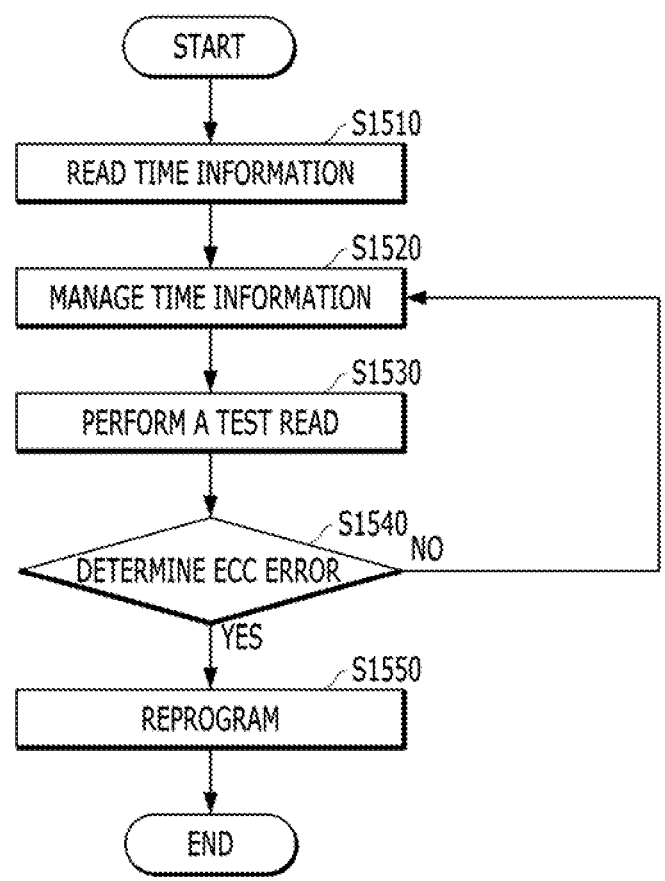
FIG. 15 is a flow diagram illustrating an operation of the memory system according to an embodiment of the present invention.

FIG. 15 is a flowchart illustrating an operation of a memory system, according to an embodiment of the present invention. For example, the operation of FIG. 15 may be performed by the controller 130 of the memory system 110 in FIG. 12

1) Read Time Information TS at Step S1510

The controller 130 reads time information TSr from a selected memory block (e.g., 152) among the plurality of memory blocks 152, 154, and 156 of the memory device 150. Specifically, the controller 130 may obtain the time information TSr about data stored in the user data region 1230 of the memory block 152 by reading control information stored in the meta data region 1210 of the memory block 152. The memory block 152 may be periodically selected and managed for a test read operation when the time information TSr has smaller size and load for its read operation than the stored data.

2) Manage Time Information TS at Step S1520

The TS management unit 148 of the controller 130 compares the time information TSr, which is read from the memory device 150, with time information TSc, which is newly generated by the time stamp generation unit 146. Furthermore, the TS management unit 148 may set the test read sequence/time of the corresponding data based on a difference between the generated time information TSc and the read time information TSr. For example, the TS management unit 148 may group pages in which the corresponding data is stored based on the difference between the generated time information TSc and the read time information TSr and set the sequence/time of a test read operation to be performed on each group. Accordingly, when the difference between the generated time information TSc and the read time information TSr is smaller, a lapse of the program time of the corresponding data is less great. Accordingly, a test read operation may be performed later on a corresponding page.

3) Perform Test Read at Step S1530

A test read operation is performed on the pages of a group that belongs to the groups formed at step S1520 which has a large difference between the generated time information TSc and the read time information TSr. Specifically, pages of a group having a difference between the generated time information TSc and the read time information TSr which is equal to or greater than a preset first threshold value TH1 (TSc−TSr≥TH1), are determined to have passed through some time after data has been programmed thereto. Among those pages, the test read operation may be performed earlier on a page having a greater difference between the generated time information TSc and the read time information TSr. Accordingly, a test read operation may be performed first on such a group. In contrast, a test read operation may be sequentially performed on the remaining groups over time. Furthermore, each of the test read operations may be performed during an idle time when there is no task requested by the host 102.

4) Determine ECC Error at Step S1540

The controller 130 may detect a data error on which the test read operation has been performed using the ECC unit 138 and determine reliability of the data based on the detected error. If, as a result of the determination of the ECC error, the number of detected error bits is greater than or equal to a preset second threshold value TH2 (Yes, error bits≥TH2), the controller 130 determines that the corresponding data has a good possibility that a read retry will subsequently occur and proceeds to step S1550. In contrast, if, as a result of the determination of the ECC error, the number of detected error bits is less than the preset second threshold value TH2 (No, error bits<TH2), the controller 130 determines that the corresponding data has a poor possibility that a read retry will subsequently occur and proceeds to step S1520. In this case, the preset second threshold value TH2 may be smaller than the number of bits, which may be corrected by the ECC unit 138. For example, the preset second threshold value TH2 may be set to 70% of the number of correctable bits.

Furthermore, the TS management unit 148 of the controller 130 may regroup a page in each of which the number of detected error bits is less than the preset second threshold value TH2 (i.e., error bits<TH2) based on a result of the determination of the ECC error at step S1540. In particular, although each of such pages has errors of the reference value or less, a program lapse time for the page has already exceeded the reference value. Accordingly, the page may be included in a higher group that belongs to the remaining groups and on which a test read operation is preferentially performed. In an embodiment, the page may be included in a higher group in proportion to the number of detected error bits.

5) Reprogram Page at Step S1550

The controller 130 may reprogram a page in which the number of detected error bits is greater than or equal to the preset second threshold value TH2 (i.e., error bits≥TH2) based on a result of the determination of the ECC error at step S1540. In this case (S1540, Yes), the page may be reprogrammed into the memory block 154 or 156 different from the memory block 152 in which the page has been first stored. Furthermore, the controller 130 may correct detected errors through the ECC unit 138 and reprogram data whose errors have been corrected.

As described above, the memory system according to an embodiment of the present invention can store time information along with data when performing a program operation on the data and manage the data. Furthermore, the memory system can reduce a load by managing a large amount of data together using time information and selectively performing a test read operation based on time information.

Furthermore, the memory system can reduce a possibility that a red error or read retry will subsequently occur by grouping data based on time information and regrouping/reprogramming data after a lapse of a specific time. That is, read performance of the memory system can be improved. As a result, the loss of data attributable to the deterioration of the retention characteristic of a memory cell over time can be prevented.

For example, in the present embodiment, data has been illustrated as being grouped and managed on a page basis based on time information. In an embodiment, however, data may be managed on a page or memory block basis depending on a memory load because time information can be recorded based on an ECC processing unit.

This technology can reduce a possibility that a red error or read retry will subsequently occur by grouping data based on time information and regrouping/reprogramming data after a lapse of a specific time. Furthermore, this technology can improve read performance of the memory system and prevent the loss of data attributable to the deterioration of the retention characteristic of a memory cell over time.

Although various embodiments have been described for illustrative purposes, it will be apparent to those skilled in the art that various changes and modifications may be made without departing from the spirit and/or scope of the invention as defined in the following claims.

What is claimed is:

1. An operating method of a memory system including a plurality of memory blocks, comprising:
grouping pages of a selected memory block among the plurality of memory blocks based on a program time;
sequentially performing a test read on the groups of the pages;
detecting an error in the pages of the test-read groups; and
reprogramming a page selected based on a result of the error detection,
wherein the sequentially performing of the test read on the groups comprises performing the test read at a specific time interval in order of the groups of the pages from a group of pages having a longer lapse of a program time to a group of pages having a shorter lapse of a program time.

2. The operating method of claim 1, wherein the detecting of the error in the pages of the test-read groups comprises:
detecting a number of error bits included in each of the pages; and
comparing the number of detected error bits with a set threshold value.

3. The operating method of claim 2, wherein a page selected based on the detection of the error and a result of the comparison comprises a first page which has the number of detected error bits equal to or greater than the set threshold value, among the pages of the test-read groups.

4. The operating method of claim 2, further comprising:
regrouping a second page which has the number of detected error bits less than the set threshold value, among the pages of the test-read groups, into remaining groups other than the test-read groups.

5. The operating method of claim 4, wherein the regrouping of the second page comprises including the second page in a higher group on which test read is preferentially performed, among the remaining groups.

6. The operating method of claim 4, wherein the regrouping of the second page comprises including the second page in one of the remaining groups based on the number of detected error bits of the second page.

7. The operating method of claim 1, wherein the page selected based on the result of the error detection is reprogrammed into another memory block among the plurality of memory blocks other than the selected memory block.

8. The operating method of claim 1, wherein the sequentially performing of the test read and the reprogramming of the page are performed during an idle time when there is no task requested by a host.

9. The operating method of claim 1, further comprising:
correcting an error detected in the selected page before reprogramming the selected page based on the result of the error detection.

10. An operating method of a memory system including a plurality of memory blocks, comprising:
grouping pages of a selected block among the plurality of memory blocks by arranging the pages in order of a longer program lapse time;
performing a test read on a first group of pages which has a program lapse time equal to or greater than a first threshold value, among the groups;
detecting an error in the first page group;
reprogramming a selected page of the first page group based on a result of the detection of the error; and
regrouping pages other than the selected page into remaining groups.

11. The operating method of claim 10, further comprising:
performing of the test read on the remaining groups based on the program lapse time; and
reprogramming and regrouping for the remaining groups.

12. The operating method of claim 10, wherein when programming data into pages of the selected block, program time information about the pages is stored in a meta region of the selected block.

13. The operating method of claim 12, further comprising, before grouping the pages of the selected block:
reading the program time information stored in the meta region;
generating current time information; and
comparing the program time information with the current time information.

14. The operating method of claim 10, wherein the detecting of the error in the first page group comprises:
detecting a number of error bits included in each of the pages; and comparing the number of detected error bits with a second threshold value.

15. The operating method of claim 14, wherein the second threshold value is smaller than a number of error bits which is correctable by an error correction code (ECC) unit.

16. The operating method of claim 14, further comprising correcting an error detected in the selected page before reprogramming the selected page of the first page group based on the result of the detection of the error.

17. The operating method of claim 10, wherein the regrouping of the pages other than the selected page into the remaining groups comprises including the pages other than the selected page in a higher group on which test read is preferentially performed, among the remaining groups.

18. The operating method of claim 10, wherein the regrouping of the pages other than the selected page into the remaining groups comprises including the pages in corresponding groups of the remaining groups based on a number of detected error bits of each of the pages other than the selected page.

19. The operating method of claim 10, wherein after the performing of the test read and the reprogramming and regrouping are repeated by a specific number, pages of a final remaining group are reprogrammed into another memory block of the plurality of memory blocks other than the selected memory block.

* * * * *